(12) United States Patent
Nagashima et al.

(10) Patent No.: US 7,947,577 B2
(45) Date of Patent: May 24, 2011

(54) METHOD AND APPARATUS FOR PRODUCING GROUP III NITRIDE

(75) Inventors: Toru Nagashima, Shunan (JP); Kazuya Takada, Shunan (JP); Hiroyuki Yanagi, Shunan (JP); Manabu Harada, Shunan (JP); Yasunori Hirata, Shunan (JP); Keisuke Kondo, Shunan (JP)

(73) Assignee: Tokuyama Corporation, Shunan-shi (JP)

( * ) Notice: Subject to any disclaimer, the term of this patent is extended or adjusted under 35 U.S.C. 154(b) by 126 days.

(21) Appl. No.: 12/440,413

(22) PCT Filed: Aug. 3, 2007

(86) PCT No.: PCT/JP2007/065679
§ 371 (c)(1),
(2), (4) Date: Mar. 6, 2009

(87) PCT Pub. No.: WO2008/029589
PCT Pub. Date: Mar. 13, 2008

(65) Prior Publication Data
US 2010/0029065 A1 Feb. 4, 2010

(30) Foreign Application Priority Data
Sep. 8, 2006 (JP) ................................. 2006-244675

(51) Int. Cl.
*H01L 21/20* (2006.01)
*C23C 16/00* (2006.01)
(52) U.S. Cl. ................. 438/478; 257/E21.108; 118/715
(58) Field of Classification Search .................. 438/478, 438/5, 47, 483, 22, 609, 689; 257/94, 79, 257/E21.09, 613, E21.097, E21.108; 118/715, 118/718, 719
See application file for complete search history.

(56) References Cited

U.S. PATENT DOCUMENTS
5,997,649 A   12/1999   Hillman
(Continued)

FOREIGN PATENT DOCUMENTS
EP   0 979 882 A1   2/2000
(Continued)

OTHER PUBLICATIONS

Kumagai et al., "Growth of thick AlN layers by hydride vapor-phase epitaxy", 2005, Journal of Crystal Growth, vol. 281, No. 1, pp. 47-54.*

(Continued)

*Primary Examiner* — Thomas L Dickey
*Assistant Examiner* — Nikolay Yushin
(74) *Attorney, Agent, or Firm* — Birch, Stewart, Kolasch & Birch, LLP

(57) ABSTRACT

A method of producing a group III nitride such as aluminum nitride, comprising the step of reacting a group III halide gas such as aluminum trichloride gas with a nitrogen source gas such as ammonia gas in a growth chamber to grow a group III nitride on a substrate held in the growth chamber, wherein the method further comprises premixing together the group III halide gas and the nitrogen source gas to obtain a mixed gas and then introducing the mixed gas into the growth chamber without forming a deposit in the mixed gas substantially to be reacted each other.

For the growth of a group III nitride such as an aluminum-based group III nitride by HVPE, there are provided a method of producing the group III nitride having as high quality as that obtained by the method of the prior art at a high yield and an apparatus used in the method.

9 Claims, 2 Drawing Sheets

U.S. PATENT DOCUMENTS

| | | | |
|---|---|---|---|
| 2002/0155713 A1* | 10/2002 | Tsvetkov et al. | 438/689 |
| 2005/0166835 A1 | 8/2005 | Koukitsu et al. | |
| 2008/0063584 A1 | 3/2008 | Koukitu et al. | |

FOREIGN PATENT DOCUMENTS

| | | | |
|---|---|---|---|
| EP | 0973882 | * | 2/2000 |
| EP | 1 494 269 A1 | | 1/2005 |
| FR | 2 727 693 A1 | | 6/1996 |
| FR | 272693 | * | 6/1997 |
| GB | 2415707 | * | 4/2006 |
| GB | 2 415 707 A | | 1/2008 |
| JP | 2001-508836 A | | 7/2001 |
| JP | 2002-316892 A | | 10/2002 |
| JP | 2003-212697 A | | 7/2003 |
| JP | 2003-303774 A | | 10/2003 |
| JP | 2006-73578 A | | 3/2006 |
| JP | 2006-114845 A | | 4/2006 |
| WO | WO9617973 | * | 6/1996 |
| WO | WO 96/17973 A1 | | 6/1998 |

OTHER PUBLICATIONS

Cai et al., "Modeling of gas phase and surface reactions in an aluminum nitride growth system", 2006, Journal of Crystal Growth, vol. 293, No. 1, pp. 136-145.*

Bliss et al., "Aluminum nitride substrate growth by halide vapor transport epitaxy", 2003, Journal of Crystal Growth, vol. 250, No. 1-2, pp. 1-6.*

European Patent Oficcee Search Rerport, dated by Dec. 16, 2010 in corresponding European Paten Applocation No. 0770292325.*

Safvi et al., "Effect of reactor geometry and growth parameters on the uniformity and material properties of GaN/sapphire grown by hydride vapor-phase epitaxy", 1997, Journal of Crystal Growth, vol. 182, No. 3-4, pp. 232-240.*

Kumagai et al., "Growth of thick AlN layers by hydride vapor-phase epitaxy", 2005,Journal of Crystal Growth, vol. 281, No. 1, pp. 62-67.*

Egashira et al., "Cluster Size Determination in the Chemical Vapor Deposition of Aluminum Nitride", J. Am. Ceram. Soc., pp. 2009-2016, vol. 77, No. 8, 1994.

Akinori Koukitu et al.; Thermodynamic analysis of AlGaN HYPE Growth; Journal of Crystal Growth; vol. 281; No. 1; Jul. 15, 2005; pp. 47-54.

D. Cai et al.; Modeling of gas phas and surface reactions in an aluminum nitride growth system; Journal of Crystal Growth; vol. 293; No. 1; Jul. 15, 2006; pp. 136-145.

D.F. Bliss et al.; Aluminum nitride substrate growth by halide vapor transport epitaxy, Journal of Crystal Growth, vol. 250; No. 1-2; Mar. 1, 2008; pp. 1-6.

European Search Report dated Dec. 16, 2010 issued in corresponding European Patent Application No. 07792325.8.

S.A. Safvi et al.; Effect of reactor geometry and growth parameters on the uniformity and material properties of GaN/sapphire growth by hydride vapor-phase epitaxy; Journal of Crystal Growth; vol. 182; No. 3-4, Dec. 1, 1997; pp. 233-240.

Yoshinao Kumagai et al.; Growth of thick AlN layers by hydride vapor-phase epitaxy; Journal of Crystal Growth; vol. 281; No. 1; Jul. 15, 2005; pp. 62-67.

* cited by examiner

US 7,947,577 B2

METHOD AND APPARATUS FOR PRODUCING GROUP III NITRIDE

TECHNICAL FIELD

The present invention relates to a method and apparatus for producing a group III nitride from a group III halide gas by a chemical vapor deposition technique.

BACKGROUND ART

Group III nitride semiconductor crystals such as aluminum nitride, gallium nitride and indium nitride have a wide range of band gap energy and the band gap energy values of these substances are about 6.2 eV, about 3.4 eV and about 0.7 eV, respectively. A mixed crystal semiconductor having any composition can be formed from these group III nitride semiconductors, thereby making it possible to obtain a band gap energy value between the above band gap energy values according to the composition of the mixed crystal.

Therefore, it is theoretically possible to manufacture a light emitting device which emits a wide range of light from infrared light to ultraviolet light by using the group III nitride semiconductor crystals. Particularly, the development of a light emitting device using an aluminum-based group III nitride semiconductor (mainly aluminum gallium nitride mixed crystal) is now under way energetically. Short-wavelength light of an ultraviolet range can be emitted by using an aluminum-based group III nitride semiconductor, and light emitting sources such as an ultraviolet light emitting diode for white light sources, an ultraviolet light emitting diode for sterilization, a laser which can be used to read and write a high-density optical disk memory and a communication laser can be manufactured.

A light emitting device using an aluminum-based group III nitride semiconductor (also called "aluminum-based group III nitride semiconductor light emitting device") can be manufactured by forming semiconductor single crystal thin films as thick as several microns (more specifically, thin films which serve as a p type semiconductor layer, a light emitting layer and an n type semiconductor layer) sequentially on a substrate like a conventional semiconductor light emitting device. The formation of the semiconductor single crystal thin films can be carried out by a crystal growth process such as molecular beam epitaxy (MBE) or metalorganic vapor phase epitaxy (MOVPE). The formation of a preferred multi-layer structure for the aluminum-based group III nitride semiconductor light emitting device by using the above process is now under study.

Currently, the substrate for use in ultraviolet light emitting devices is generally a sapphire substrate from the viewpoints of crystal quality as a substrate, ultraviolet light transmission, mass-productivity and cost. However, when the sapphire substrate is used, problems arise due to differences in physical properties between the sapphire substrate and aluminum gallium nitride forming a semiconductor multi-layer film.

For example, a crystal defect called "misfit dislocation" is introduced into a semiconductor multi-layer film due to a difference in lattice constant between the substrate and the semiconductor multi-layer film. Further, as there is a difference in thermal expansion coefficient between a growth layer and the substrate, the growth layer or the substrate cracks or warps due to the difference in thermal expansion coefficient while the temperature is reduced from the temperature for forming the semiconductor multi-layer film in the manufacture of the semiconductor multi-layer film. The above dislocation or crack reduces the light emitting performance of the semiconductor multi-layer film.

To solve these problems, various film forming conditions and structures have been contrived for the semiconductor multi-layer film. However, to solve the above problems substantially, it is ideal to use a substrate having a lattice constant close to that of the semiconductor multi-layer film and a small difference in thermal expansion coefficient from that of the semiconductor multi-layer film. It can be said that an aluminum-based group III nitride single crystal substrate, that is, an aluminum nitride single crystal substrate or an aluminum gallium nitride single crystal substrate is the most suitable substrate. However, an aluminum-based group III nitride single crystal substrate having a large area and homogeneity cannot be manufactured stably at present. If a high-quality aluminum-based group III nitride single crystal substrate can be manufactured, it solves the above problems and expected to contribute to the improvement of light emitting performance and the implementation of an ultraviolet light source.

Since an aluminum-based group III nitride single crystal must have a thickness of at least 100 μm to be used as a substrate, it is not practical to manufacture an aluminum-based group III nitride single crystal substrate using the above crystal growth process having a slow film forming speed.

As an aluminum-based group III nitride single crystal growing method having a fast film forming speed, there is known hydride vapor phase epitaxy (HVPE) (refer to JP-A 2003-303774, JP-A 2006-073578 and JP-A 2006-114845). Since it is difficult to control the film thickness accurately in HVPE as compared with MBE and MOVPE, HVPE is not suitable for the formation of a crystal layer for semiconductor light emitting devices but capable of obtaining a single crystal having high crystallinity at a fast film forming speed. Therefore, an aluminum-based group III nitride single crystal substrate which could not be obtained by conventional MBE and MOVPE can be mass-produced at a practical level by HVPE.

To grow an aluminum-based group III nitride crystal by HVPE, for example, a vapor-phase epitaxial apparatus shown in FIG. 1 is used. The apparatus shown in FIG. 1 comprises a reactor body composed of a cylindrical quartz glass growth chamber (reaction tube) 11, heating means 12 arranged outside the growth chamber 11 and a substrate support table (also simply called "susceptor" hereinafter) 13 installed in the growth chamber 11 and has a structure that carrier gases and a raw material gases are supplied from one end portion of the growth chamber 11 and the carrier gases and an unreacted gas are discharged from the other end portion.

The growth chamber on the raw material gas feed side has a concentric triple tube nozzle structure that a triple tube is inserted into a predetermined area from the end portion, a group III halide gas containing aluminum halide which is a group III element source gas diluted with a carrier gas (for example, a hydrogen gas) is supplied through the inside space of the inner tube 15 of the triple tube, a nitrogen source gas (for example, an ammonia gas) diluted with a carrier gas (for example, a hydrogen gas) is supplied through the space between the intermediate tube 16 and the outer tube 17 of the triple tube, and a barrier gas (for example, a nitrogen gas) is supplied through the space between the inner tube 15 and the intermediate tube 16. The barrier gas is supplied to prevent the blockage of a gas exhaust port by a product which is formed right after the group III element source gas and the nitrogen source gas are mixed together and reacted with each other and deposited near the gas exhaust port.

The substrate (for example, a sapphire substrate) 14 is placed on the susceptor 13 and heated by the heating means to grow an aluminum-based group III nitride through a reaction between the group III element source gas and the nitrogen source gas on the substrate 14.

The substrate is generally heated at 1,000° C. or higher to obtain a good crystal layer (growth layer). To heat the substrate, there are (1) a method in which the growth chamber is directly heated with a heater provided outside the growth chamber to heat the substrate by heat conduction or radiation heat through the wall of the reactor, (2) a method in which a cylindrical heat generating member (for example, carbon) provided in the growth chamber is heated by high-frequency heating from the outside of the growth chamber to heat the substrate by its radiation heat, (3) a method in which the substrate is held on a carbon susceptor and the susceptor is heated by high-frequency heating from the outside of the growth chamber to heat the substrate by its heat conduction, (4) a method in which light is applied from the outside of the growth chamber to heat the substrate, (5) a method in which a heating element is buried in the susceptor and electricity is applied to heat the susceptor so as to heat the substrate by its heat conduction, and (6) a method in which the susceptor and/or the substrate are/is heated by an electromagnetic wave such as microwave.

When an aluminum-based group III nitride is produced by HVPE using the conventional vapor-phase epitaxial apparatus shown in FIG. 1, the yield is less than 10%. Therefore, it cannot be said that productivity is always satisfactory. The term "yield" as used herein means the group III metal ratio (wt %) of the aluminum-based group III nitride immobilized on the substrate to the supplied group III raw material gas.

As a method in which a halide gas and an ammonia gas as the nitrogen source gas are used like the method of the present invention, there is known one in which aluminum nitride particles are formed from an aluminum trichloride gas and an ammonia gas by external heating system at a maximum temperature of about 1,100° C. (refer to the Journal of American Ceramics Society 77 [8] 2009-2016, (1994)). In the method of the present invention, the substrate is heated up to 2,000° C. by limiting the gas supply temperature and the pipe heating temperature at the time of carrying the gases more precisely to form bulk single crystals or polycrystals on the substrate. Therefore, this method basically differs from the method of forming solid powders simply by reacting raw material gases.

DISCLOSURE OF THE INVENTION

It is an object of the present invention to provide a method and apparatus for producing a group III nitride having the same quality as that obtained by the conventional method at a high yield, that is, a high productivity when a group III nitride such as an aluminum-based group III nitride is grown by HVPE.

The inventors of the present invention have conducted intensive studies to attain the above object. As a result, they found that the yield was low because a group III raw material gas and a nitrogen source gas were not uniformly mixed together before they reached the substrate and a mixed gas of these gases did not contact the substrate efficiently in HVPE of the prior art in which these gases are separately introduced into a growth chamber and mixed together in the growth chamber.

The inventors of the present invention thought that when both of the raw material gases were premixed together and then blown near the substrate, the yield could be improved. When they tried this method, they found that a solid component deposited in the pipe or the ejection port of the nozzle, thereby making it substantially impossible to grow a group III nitride on the substrate.

Then, they studied the reactivity of a mixed gas of the group III raw material gas and the nitrogen source gas and found that when a group III halide gas was used as the group III raw material gas, a stable state needed to be maintained to prevent the formation of a deposit from a mixed gas of it and the nitrogen source gas and conditions for keeping this state. The present invention was accomplished based on these findings.

That is, according to a first aspect of the present invention, there is provided method of producing a group III nitride, comprising the step of reacting a group III halide gas with a nitrogen source gas in a growth chamber to grow a group III nitride on a substrate held in the growth chamber, wherein the method further comprises premixing together the group III halide gas and the nitrogen source gas before they are introduced into the growth chamber and introducing the mixed gas obtained in the premixing step into the growth chamber without forming a deposit in the mixed gas substantially.

In the above method, mixing of the group III halide gas and the nitrogen source gas in the above premixing step is carried out at a temperature T (° C.) ranging from the lower limit temperature specified by the following mathematical expression (1) to lower than 600° C. when the supply partial pressure of the group III halide gas to be supplied is represented by P (atm), and the mixed gas is introduced into the growth chamber by keeping the temperature of the obtained mixed gas at a range from the above lower limit temperature to lower than 600° C., thereby making it possible to introduce the mixed gas into the growth chamber without forming a deposit substantially and therefore to blow it against the substrate directly. Therefore, the yield can be greatly improved.

$$T = \frac{-2.40 \times 1000}{\log P - 3.03} - 273.15 \quad (1)$$

The above temperature range is determined based on the results of a reference experiment (to be mentioned hereinafter) for investigating whether a solid is deposited or not when a mixed gas is formed and distributed in a soaking area under the conditions that the apparatus shown in FIG. 2 is used, an aluminum trichloride gas is used as the group III halide gas, an ammonia gas is used as the nitrogen source gas, and the supply partial pressure of the aluminum trichloride gas and the temperature of the soaking area are used as parameters.

The lower limit of the temperature range within which the mixed gas can be kept stably corresponds to the deposition temperature of an adduct of the group III halide gas and the nitrogen source gas whereas the upper limit corresponds to the formation temperature of a group III nitride. Particularly the lower limit may be influenced by the concentration of the mixed gas or the pressure of the whole mixed gas. When the supply partial pressure of the halogen gas of the group III element to be supplied is represented by P (atm) and the temperature is represented by T (° C.), if the temperature range is from the lower limit temperature specified by the mathematical expression (1) to lower than 600° C., the mixed gas can be kept stably without forming a deposit in a wide variety of mixed gas systems including the aluminum trichloride-ammonia mixed gas system.

According to a second aspect of the present invention, there is provided an apparatus for producing a group III nitride, having a growth chamber comprising gas introduction ports for introducing a group III halide gas and a nitrogen source gas, gas exhaust ports, a susceptor for holding a substrate, and heating means for heating the substrate, wherein the apparatus further comprises a gas introduction nozzle having a temperature control function and a gas mixer, the gas introduction nozzle is connected to the gas mixer, and the gas mixer is connected to the group III halide gas introduction port and the nitrogen source gas introduction port at an upstream.

BEST MODE FOR CARRYING OUT THE INVENTION

In the method of the present invention, a group III halide gas and a nitrogen source gas are reacted with each other in a growth chamber to grow a group III nitride on a substrate held in the growth chamber so as to produce the group III nitride. The terms "group III nitride" and "group III halide" as used herein mean a nitride of a group III element and a halide of a group III element, respectively, and the group III element is an element which belongs to the group III (or group 13) of the periodic table, that is, at least one element selected from the group consisting of B, Al, Ga, In and Tl.

The method of the present invention and the apparatus of the present invention will be described hereinunder with reference to the accompanying drawings.

Figure 4:
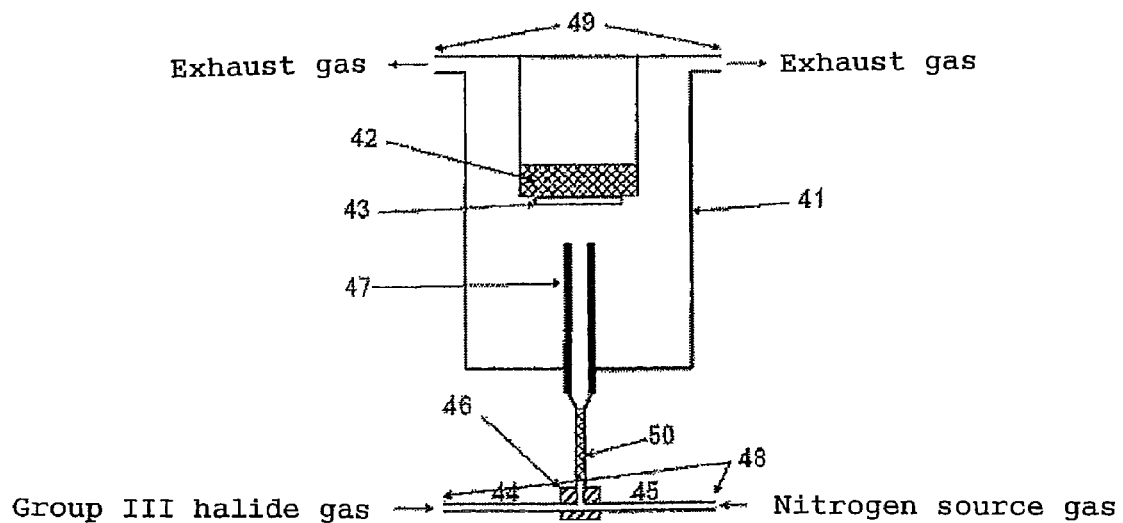
FIG. 4 is a schematic diagram of the typical apparatus of the present invention.

FIG. 4 is a schematic diagram of the typical apparatus of the present invention. The apparatus shown in FIG. 4 has a growth chamber 41 comprising gas introduction ports 48 for introducing the group III halide gas and the nitrogen source gas, gas exhaust ports 49, a susceptor 42 for holding the substrate and heating means for heating the substrate. An external heating device similar to the external heating device 12 in FIG. 1 may be installed outside the growth chamber 41 to heat the substrate from the outside for supporting. However, it is not always necessary in the apparatus of the present invention.

The material of the growth chamber 41 is selected from corrosion resistant metals such as graphite, stainless steel, inconel and Hastelloy, and quartz glass. Out of these, quartz glass is preferred from the viewpoint of reducing contamination from the wall. When a metal is used, contamination from a metal housing can be prevented by maintaining the temperature of the contact surface with the gases at about room temperature with a water cooling jacket.

The susceptor 42 has a substrate holding surface to hold the substrate 43 thereon. As the substrate 43 may be used a crystal substrate made of sapphire, silicon, silicon carbide, zirconium boride, gallium arsenide, gallium phosphorus, zinc oxide, gallium nitride or aluminum nitride. Further, a template substrate having a thin film aluminum nitride crystal layer formed on a base substrate made of sapphire may also be used.

In the apparatus shown in FIG. 4, a heat element is buried in the susceptor 42 and functions as a heater for heating the substrate. The heating means for heating the substrate may employ various heating systems such as high-frequency induction heating and optical heating which are employed in the conventional apparatus shown in FIG. 1.

The material of the susceptor 42 is preferably a nitride such as boron nitride or aluminum nitride. To provide the function of a heater to the susceptor, a heat element is buried in the susceptor body or bonded to the rear surface of the susceptor body and electric power is supplied to the heat element from the outside. As the heat element is used a material which does not melt at use temperature, for example, carbon (C), tungsten (W), molybdenum (Mo) or tantalum (Ta).

The material constituting the susceptor body is not particularly limited if it is stable at use temperature and hardly corroded by the group III halide gas. However, a nitride having high heat conductivity, for example, aluminum nitride or boron nitride is preferably used because the whole surface on which the substrate is mounted of the susceptor can be uniformly heated at least.

The apparatus shown in FIG. 4 has a gas introduction nozzle 47 having a temperature control function, a line mixer 50 and a gas mixer 46. At the upstream, the above gas mixer 46 is connected to a group III halide gas supply source (not shown) through a pipe 44 and a gas introduction port 48 and to a nitrogen source gas supply source (not shown) through a pipe 45 and a gas introduction port 48.

In the present invention, the group III halide gas and the nitrogen source gas are premixed together and then the obtained mixed gas is introduced into the growth chamber. Therefore, the apparatus used in the present invention has the gas mixer for mixing the above two different raw material gases at an upstream of the gas introduction nozzle 47.

The gas mixer is an apparatus for joining two or more gas distribution channels to form one gas distribution channel and is not limited to a particular shape if it can mix together different types of gases.

As a specific example of the mixer, to join together two gas distribution channels so as to form one gas distribution channel, a T-shaped connecting pipe or Y-shaped connecting pipe can be advantageously used. To join together three gas distribution channels so as to form one gas distribution channel, a crucial connecting pipe can be advantageously used. Alternatively, two gas distribution channels may be joined together to form one distribution channel and a third gas distribution channel may be joined to the above distribution channel.

The group III halide gas and the nitrogen source gas which have been joined together in the gas mixer are mixed together before they are ejected from the gas introduction nozzle 47. Mixing is mainly carried out by a diffusion function. The passage time from the time when they are joined together in the gas mixer to the time when they reach the end of the gas introduction nozzle is desirably 0.01 second or more.

As a more preferred example, the line mixer 50 is preferably installed on the downstream side of the gas mixer in which the gas distribution channels are joined together to form one gas distribution channel so as to promote mixing. The line mixer has a mixing blade which is installed in a gas flow passage like a pipe and flows of different types of gases are forcedly disturbed by the blade while passing through the line mixer 50 to be mixed together. By using the line mixer, different types of gases can be mixed together in a short period of time during the transport of the gases.

The gas mixer 46 and the line mixer 50 are preferably capable of controlling the temperature of the mixed gas. A ribbon heater may be wound round the gas mixer, or a liquid heat medium around the gas mixer is heated to a target temperature. When the supply partial pressure of the group III halide gas to be supplied is represented by P (atm), the deposition of a solid in the gas mixer is prevented by controlling the temperature T (° C.) to a range from the lower limit temperature specified by the mathematical expression (1) to lower than 600° C.

As the gas mixer may be used a pipe made of a corrosion resistant metal such as stainless steel or inconel, or quartz glass. A material having high chemical durability is preferably used for pipe heating.

The gas mixer 46 is connected to the group III halide gas supply source (not shown) through the pipe 44 and the gas introduction port 48 at an upstream so that a predetermined amount of the gas can be supplied by flow rate control means such as a mass flow controller installed in the pipe. Similarly, the gas mixer 46 is connected to the nitrogen source gas supply source (not shown) through the pipe 45 and the gas introduction port 48 at an upstream so that a predetermined amount of the gas can be supplied by flow rate control means such as a mass flow controller installed in the pipe.

The group III halide gas is preferably an aluminum halide gas or a mixed gas of an aluminum halide gas and a halide gas of a group III element except aluminum. Since the halide has a high saturated vapor pressure, the amount of the raw material supplied onto the substrate can be increased, thereby making high-speed growth possible.

The type of the aluminum halide gas is not particularly limited. When quartz glass is used in a portion in contact with a reactive gas, an aluminum trichloride gas is preferably used because it has low reactivity with quartz glass. Examples of the halide gas of a group III element except aluminum include gallium chloride and boron chloride gases.

When a mixed gas of an aluminum halide gas and a halide gas of a group III element except aluminum is used as the group III halide gas, its composition may be suitably set according to the composition of the target aluminum-based group III nitride mixed crystal. In this case, since the reaction speed with the nitrogen source gas differs according to the type of the group III element, the feed rate of the group III halide gas may not correspond to the composition of the mixed crystal. Therefore, it is preferred to check the relationship between the composition of the gas and the composition of the product in advance.

The group III halide gas can be obtained by reacting a group III metal such as aluminum, gallium or indium with a hydrogen halide or chlorine gas. For example, as described in JP-A 2003-303774, a gas generated from a reactor for carrying out the above reaction may be directly used as the group III halide gas supply source.

The group III halide gas may also be obtained by heating and vaporizing a solid or liquid group III halide such as aluminum halide, gallium halide or indium halide. In this case, an anhydrous crystalline group III halide having high purity is preferably used. When impurities are contained in the raw material gas, not only it may produce a defect in the formed crystal but also it may cause changes in physical properties, chemical properties and electric properties.

A reactive gas containing nitrogen is used as the nitrogen source gas, and an ammonia gas is preferred from the viewpoints of cost, reactivity and handling ease.

Preferably, the group III halide gas and the nitrogen source gas are each diluted with a carrier gas to a desired concentration and then introduced into the gas mixer. The carrier gas is, for example, a hydrogen, nitrogen, helium or argon gas or a mixed gas thereof. It is preferred that an impurity gas component such as oxygen, steam, carbon monoxide or carbon dioxide should be removed by using a refiner.

In the present invention, it is important that the group III halide gas and the nitrogen source gas should be premixed together before they are introduced into the growth chamber and that the mixed gas obtained in the premixing step should be introduced into the growth chamber without forming a deposit in the gas substantially. Conditions for achieving this state can be determined based on the results of the following reference experiment.

Reference Experiment

Figure 2:
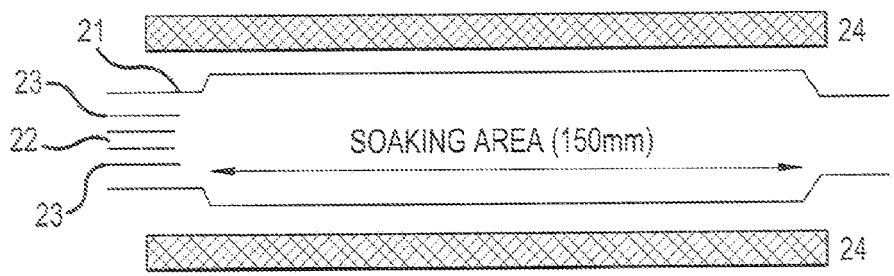
FIG. 2 is a schematic diagram of an apparatus used in a reference experiment.

In the apparatus shown in FIG. 2, a group III halide gas introduction nozzle 22 is provided on one side of a quartz reaction tube 21 having an inner diameter of 20.5 mm, and the group III halide gas diluted with a carrier gas (hydrogen gas) is supplied from the inside of the group III halide gas introduction nozzle 22. A barrier nozzle 23 for distributing a nitrogen gas flow (so-called "barrier gas") is formed concentrically around the group III halide gas introduction nozzle 22. Further, the nitrogen source gas diluted with a carrier gas (hydrogen gas) is supplied from the outer side of the barrier gas nozzle. The supplied group III halide gas, barrier gas, nitrogen source gas and carrier gas are mixed together in the quartz reaction tube 21. The group III halide gas and the nitrogen source gas react with each other while passing through a soaking area having a total length of 150 mm and exhausted.

In the reference experiment, the above soaking area was heated at 100 to 650° C. by an external heating device 24. The group III halide gas and the carrier gas (hydrogen gas) were supplied from the group III halide gas introduction nozzle 22 to ensure that the total flow rate of these gases became 300 sccm (standard cubic centimeter per minute), the nitrogen gas was supplied from the barrier nozzle 23 at a flow rate of 50 sccm, the nitrogen source gas and the carrier hydrogen gas were supplied from a portion around the barrier nozzle 23 at a total flow rate of 300 sccm, and the total flow rate of all the gases after mixing was set to 650 sccm. At this point, the inside pressure of the growth chamber was set to 1 atm. An aluminum trichloride gas was supplied as the group III halide gas at a supply partial pressure for the total gas flow volume of $9 \times 10^{-3}$ to $1 \times 10^{-4}$ atm. To produce aluminum trichloride, as disclosed by Patent Document 1, metal aluminum and a hydrogen chloride gas were reacted with each other at 500° C. An ammonia gas was used as the nitrogen source gas and supplied at a flow rate which ensured that its supply partial pressure became 4 times the supply partial pressure of the aluminum trichloride gas. After these gases were supplied for 10 to 30 minutes, supply and heating were stopped to observe the state of solid deposition in the growth chamber so that the reaction temperature and the raw material concentrations at which solid deposition did not occur were determined.

Figure 3:
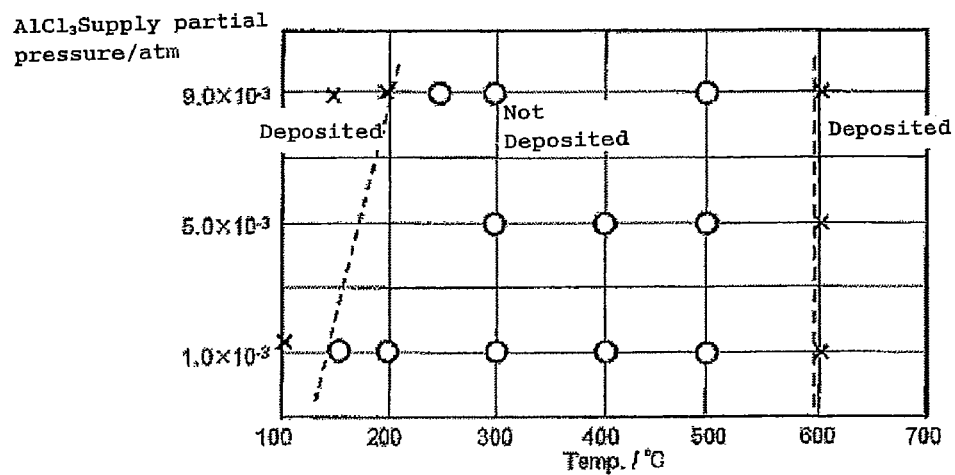
FIG. 3 is a graph showing the results of the reference experiment.

As a result, when the supply partial pressure of aluminum trichloride and the reaction temperature were used as parameters, the area in which solid deposition did not occur is shown in FIG. 3.

○ in FIG. 3 shows conditions under which solid deposition did not occur and X shows conditions under which solid deposition was seen. At a temperature range from 150° C. to lower than 600° C., it is apparent that solid deposition rarely occurs. However, at the lower limit temperature, it is seen that conditions under which solid deposition was seen are apt to be influenced by the supply partial pressure of the aluminum trichloride gas. When the supply partial pressure of the group III element halogen gas for supplying the aluminum trichloride gas is represented by P (atm) and the temperature is represented by T (° C.), the lower limit temperature can be represented approximately by the relational expression (1). At a temperature lower than the lower limit temperature, it was confirmed that a white solid deposit was existent on the inner wall of the growth chamber.

It is considered that the lower limit of the temperature range capable of keeping the mixed gas stable corresponds to the deposition temperature of a chemically bonded adduct of the group III halide gas (aluminum trichloride gas) and the nitrogen source gas (ammonia gas). Although especially the lower limit temperature may be influenced by the concentration of the mixed gas and the pressure of the whole mixed gas, the effect of the present invention can be advantageously obtained by keeping the lower limit temperature or higher based on the relational expression (1). At a temperature of 600° C. or higher, it was confirmed that a white solid deposit was existent on the inner wall of the growth chamber and the deposit formed at this temperature was aluminum nitride.

For the mixing of the group III halide gas and the nitrogen source gas and the transport of the mixed gas through pipe to the nozzle 47, it is preferred that the gas mixer and the pipes should be heated to control the temperature of the mixed gas to a range from the lower limit temperature shown by the mathematical expression (1) to lower than 600° C. When the temperature of the mixed gas is lower than the lower limit temperature shown by the mathematical expression (1), a solid is apt to be deposited from the group III halide gas or the like supplied as a raw material. When the temperature is 600° C. or higher, the group III halide gas and the nitrogen source gas supplied as a mixed gas react with each other to form a group III nitride. When a solid deposits in the pipe for these reasons, the gas composition changes to make conditions for producing the group III nitride unstable and the pipes are blocked, thereby making it difficult to produce the group III nitride.

Therefore, to control the temperature of the mixed gas in the gas mixer 46 to the above range, it is preferred that the pipe 44 and the pipe 45 should be heated to control the temperature of the circulating gas to a range from the lower limit temperature shown by the mathematical expression (1) to lower than 600° C. The gas mixer and the pipes can be heated by burying a heating element in fibers or a resin or winding a ribbon heater around them. Alternatively, a jacket in which a liquid heat medium circulates may be installed on the mixer and the pipes to circulate a liquid such as oil whose temperature is controlled to a fixed level in the jacket.

The gas introduction nozzle 47 has a temperature control function in order to introduce a mixed gas of the group III halide gas and the nitrogen source gas which have been mixed together in the gas mixer 46 into the growth chamber 41 in a stable state that a solid is not deposited. The temperature control of the gas introduction nozzle 47 can be advantageously carried out by installing a jacket in which a liquid heat medium circulates in the nozzle and circulating a liquid such as oil whose temperature is controlled to a fixed level in the jacket.

As an example of the liquid heat medium, dibenzyl toluene may be used to heat up to 350° C. As the material of the nozzle, corrosion resistant metals such as stainless steel, inconel and Hastelloy, and quartz glass may be used.

The diameter of the gas introduction nozzle 47 is not particularly limited but generally is the same or smaller than the diameter of the substrate to be installed. A shower head type nozzle having a plurality of holes for ejecting the raw material mixed gas on the end face may also be used. When the shower head type nozzle is used, the film thickness of the obtained group III nitride and the in-plane distribution of film quality become more uniform.

A description is subsequently given of the operation procedure and conditions for producing the group III nitride by the method of the present invention when the apparatus shown in FIG. 4 is used.

To produce the group III nitride using the apparatus shown in FIG. 4, the substrate of the above-mentioned material is installed on the suspector. Then, a carrier gas except for the raw material is circulated, and the gas introduction nozzle 47 is heated at the above-described temperature. Thereafter, the susceptor is heated. It is heated at a heating temperature at which the reaction of the raw material mixed gas proceeds to grow the group III nitride on the substrate, that is, 700 to 2,000° C. After a predetermined temperature is reached, the supply of the group III halide gas and the nitrogen source gas is started to deposit the group III nitride on the substrate.

As for the supply of the raw material, conditions under which solid deposition does not occur may be determined with reference to FIG. 2 and the supply partial pressure of the group III halide gas is preferably $1 \times 10^{-2}$ atm or less, more preferably $1 \times 10^{-7}$ to $1 \times 10^{-2}$ atm. When the supply partial pressure is higher than the above range, solid deposition readily occurs. The time for supplying the raw material is a time when a desired film thickness is obtained. After the supply of the raw material is stopped, the heating of the susceptor and the gas introduction nozzle is stopped to cool them and then the substrate is taken out. The group III nitride is obtained as a single crystal or polycrystal according to the growth temperature and the growth speed. As a general trend, as the growth temperature is higher and the growth speed is slower, a single crystal is obtained more easily.

The distance from the end of the gas introduction nozzle to the center of the substrate affects the yield. The mixed gas of the group III halide gas and the nitrogen source gas ejected from the gas introduction nozzle reaches the surface of the substrate and react with each other to form a group III nitride on the surface of the substrate. When the distance is long, the ratio of the raw material gas ejected from the gas introduction nozzle, which fails to reach the substrate and is scattered, becomes high. Therefore, the amount of the raw material gas reaching the surface of the substrate decreases, thereby reducing the yield. Further, when the distance is long, the residence time until the mixed gas reaches the substrate is long, whereby a solid group III nitride is formed in a gas phase and a high-quality group III nitride film may not be obtained. When the distance from the end of the gas introduction nozzle to the center of the surface of the substrate is too short, the high-temperature substrate and the low-temperature nozzle become close to each other, thereby making it difficult to control their temperatures disadvantageously. For this reason, it is recommended to set the distance to preferably 1 to 50 mm, more preferably 2 to 30 mm.

While an embodiment for carrying out the production method of the present invention using the apparatus shown in FIG. 4 has been detailed, the apparatus used in the method of the present invention is not limited to the apparatus shown in FIG. 4. Although the apparatus shown in FIG. 4 is a vertical reactor, another type of vertical reactor, a horizontal reactor, or a mixture of these reactors may be used. Reaction conditions are suitably changed according to the apparatus in use.

According to the production method of the present invention, the group III nitride can be produced at a high speed and a high yield. In addition, by suitably selecting production conditions, the crystallinity of the obtained group III nitride can be controlled and a single crystal substrate or a polycrystal substrate can be easily manufactured.

Therefore, the method of the present invention is suitable as a method of producing an aluminum nitride single crystal substrate or an aluminum gallium nitride single crystal substrate which is preferred as a substrate for the manufacture of an aluminum-based group III nitride semiconductor light emitting device. Particularly a mixed crystal composed of aluminum nitride and gallium nitride and/or indium nitride and having an aluminum nitride content of not less than 20 mol % can be used as a substrate for an ultraviolet light emitting device according to the wavelength of its emitted light, and a single crystal substrate of this mixed crystal having changed composition can be manufactured more efficiently by the method of the present invention.

The group III nitride obtained in the present invention is removed from the substrate used for growth and its removed surface is polished as required if it is a single crystal. A group III nitride whose surface is polished by chemical mechanical polishing with such high accuracy that an atomic step is exposed may be used as a self-supporting substrate for a deep ultraviolet light emitting device.

The yield, the film forming speed of the group III nitride and the crystallinity of the obtained group III nitride in the present invention can be evaluated by the following methods.

That is, the yield can be determined by obtaining the mass of a group III nitride crystal grown on the substrate from a change in the mass of the substrate before and after growth, dividing it by the molecular weight of the group III nitride crystal (for example, the molecular weight of aluminum nitride is 41) to obtain the number (A) of gram atoms of the group III metal immobilized on the substrate, obtaining the total number (B) of gram atoms of the group III halide supplied during growth from the equation (flow rate of supplied mixed gas/sccm)×(supply partial pressure of group III halide gas/atm)×(feed time/minute)÷(22,400/cc·mol$^{-1}$), and dividing (A) by (B) to obtain a percentage.

The film forming speed can be determined by measuring the average film thickness of the obtained film and dividing the obtained value by the film forming time. The average film thickness of the obtained group III nitride crystal film can be calculated from the mass of the grown crystal, the area of the substrate and the density of the group III nitride crystals (for example, the density of aluminum nitride is 3.26 g/cm$^3$).

The crystal quality of the obtained crystal film can be evaluated by X-ray rocking curve measurement. The rocking curve is diffraction obtained by fixing a detector at an angle two times the angle at which a specific crystal face satisfies the Bragg's condition of diffraction and changing the incident angle of an X-ray, and the crystal quality can be judged from the half-value width of the rocking curve. It can be said that as the half-value width becomes smaller, the crystal quality of the group III nitride crystal becomes higher. The rocking curve measurement is generally carried out in the (002) direction called "Tilt". An X-ray diffraction profile was measured at a 2θ of 10 to 100° in θ-2θ mode measurement. The θ-2θ mode measurement means a method of measuring diffraction by fixing a detector at a position of 2θ when the incident angle on a sample is represented by θ. If only the (002) diffraction and (004) diffraction are observed in the diffraction profile of the group III nitride crystal, it can be judged that the obtained group III nitride crystal is a single crystal. In the case of aluminum nitride, the (002) diffraction is observed at a 2θ of around 36.039° and the (004) diffraction is observed at a 2θ of around 76.439°.

As described above, according to the present invention, a group III nitride having the same or higher quality than the product obtained by conventional HVPE, especially an aluminum-based group III nitride crystal can be produced at a high yield, that is, high productivity.

The apparatus of the present invention is suitable for the production of a group III nitride by the method of the present invention and simpler and more compact than the apparatus of the prior art. This is because of the following reason. That is, when the raw material gases are separately introduced, a certain space is required between the nozzle and the substrate in order to mix them together uniformly whereas this space is not required in the apparatus of the present invention because the premixed raw material gases can be blown near the substrate. Since a reaction for forming a group III nitride can be carried out efficiently on the substrate in the apparatus of the present invention, only the substrate must be heated and the whole apparatus does not need to be heated, thereby making it possible to eliminate the need for an external heating device for heating the wall of the reactor.

EXAMPLES

The following examples are provided for the purpose of further illustrating the present invention but are in no way to be taken as limiting.

Example 1

A reaction for growing a single crystal of aluminum nitride which is one of group III nitrides was carried out by using the apparatus shown in FIG. 4. Aluminum trichloride was used as the group III halide gas. The aluminum trichloride was formed by reacting hydrogen chloride with metal aluminum maintained at 500° C. on the upstream (not shown) side of the pipe 44 and supplied. An ammonia gas was used as the nitrogen source gas. A ribbon heater was wound round the pipe 44, the pipe 45, the line mixer 50 and the gas mixer 46 to heat them at 300° C. to be maintained. The nozzle 47 was made of stainless steel (SUS316L) and had a structure that heating oil could be circulated in the nozzle (temperature control nozzle) to circulate the oil heated at 300° C. so as to maintain the nozzle at that temperature. At this point, the distance between the end of the nozzle 47 and the surface of the substrate 43 was 25 mm. A sapphire c-plane substrate having a diameter of 2 inches was used as the substrate and installed on the under surface of a boron nitride susceptor having a carbon heating element buried therein, and electric power was supplied to the carbon heating element to heat the substrate at 1,300° C.

4 sccm of the aluminum trichloride gas was diluted with 2,996 sccm of a hydrogen carrier gas and supplied from the pipe 44, and 16 sccm of the ammonia gas was diluted with 4,984 sccm of a hydrogen carrier gas and supplied from the pipe 45. The supplied gases were joined together in the mixer 46 through the pipe 44 and the pipe 45 and uniformly mixed together by the line mixer, and then the mixed gas was supplied onto the substrate from the nozzle. Under this condition, the supply partial pressure of aluminum trichloride in 8,000 sccm of the mixed gas was 5×10$^{-4}$ atm and the molar ratio of the ammonia gas to the aluminum trichloride gas was 4. 3,000 sccm of a nitrogen gas was circulated around the nozzle as a purge gas for exhausting air from the system, and this purge gas did not involve in the reaction directly. During growth, the inside pressure of the system was maintained at 550 Torr (1 atm is equal to 760 Torr) by a dry pump having a pressure controller.

The mixed gas was supplied onto the substrate for 60 minutes to grow an aluminum nitride single crystal on the substrate. After 60 minutes, the supply of only the aluminum trichloride gas was stopped to terminate the growth of aluminum nitride. After the substrate was cooled to 500° C., the supply of the ammonia gas was stopped and the substrate was cooled to room temperature and then taken out to be evaluated. As a result, a weight change by aluminum nitride grown on the substrate was an increase of 0.1057 g from that before growth, the average film thickness of aluminum nitride was 16 μm, and the crystal growth speed was 16 μm/hr in terms of film forming speed. The mass of the group III metal immobilized on the substrate (the mass of the immobilized group III metal) was 0.0026 mol. Since the mass of the group III halide gas supplied onto the substrate during growth (the mass of the group III metal supplied onto the substrate) was 0.0107 mol, the yield was calculated as 24%. Only the (002) diffraction and (004) diffraction of aluminum nitride except for the sapphire substrate used as the substrate were observed in the θ-2θ mode X-ray diffraction profile, and it was judged that the obtained aluminum nitride was a single crystal. The rocking curve value of "Tilt" was 300 min.

Example 2

The operation of Example 1 was repeated except that the temperature for heating the substrate was changed to 1,600° C.

The raw material mixed gas was supplied onto the substrate for 60 minutes to grow an aluminum nitride single crystal on the substrate. After 60 minutes, the supply of only the aluminum trichloride gas was stopped to terminate the growth of aluminum nitride. After the substrate was cooled to 500° C., the supply of the ammonia gas was stopped and the substrate was further cooled to room temperature and then taken out to be evaluated. As a result, a weight change by aluminum nitride grown on the substrate was an increase of 0.0925 g from that before growth, the average film thickness of aluminum nitride was 14 μm, and the crystal growth speed was 14 μm/hr in terms of film forming speed. The mass of the group III metal immobilized on the substrate (the mass of the immobilized group III metal) was 0.0023 mol. Since the mass of the group III halide gas supplied onto the substrate during growth (the mass of the group III metal supplied onto the substrate) was 0.0107 mol, the yield was calculated as 21%. The aluminum-based group III nitride crystal could be grown stably even when the substrate was heated at a high temperature. Only the (002) diffraction and (004) diffraction of aluminum nitride were observed except for the sapphire substrate used as the substrate in the θ-2θ mode X-ray diffraction profile, and it was judged that the obtained aluminum nitride was a single crystal. The rocking curve value of "Tilt" was 280 min.

Example 3

The operation of Example 1 was repeated using the apparatus shown in FIG. 4 except that the distance between the nozzle 47 and the surface of the substrate 43 in FIG. 4 was changed to 10 mm and the temperature of the temperature control nozzle was changed to 200° C.

The raw material mixed gas was supplied onto the substrate for 180 minutes to grow an aluminum nitride crystal on the substrate. After 180 minutes, the supply of only the aluminum trichloride gas was stopped to terminate the growth of aluminum nitride. After the substrate was cooled to 500° C., the supply of the ammonia gas was stopped and the substrate was further cooled to room temperature and then taken out to be evaluated. As a result, a weight change by aluminum nitride grown on the substrate was an increase of 0.6870 g from that before growth, the average film thickness of aluminum nitride was 104 μm, and the crystal growth speed was 35 μm/hr in terms of film forming speed. The mass of the group III metal immobilized on the substrate (the mass of the immobilized group III metal) was 0.0168 mol. Since the mass of the group III halide gas supplied onto the substrate during growth (the mass of the group III metal supplied onto the substrate) was 0.0322 mol, the yield was calculated as 52%. It is considered that the supply quantity of the raw material reaching the substrate increased due to a short distance between the nozzle and the substrate. The obtained aluminum nitride was white in appearance. Not only the (002) diffraction and (004) diffraction but also (100) diffraction (2θ=33.21°), (101) diffraction (2θ=37.92°), (102) diffraction (2θ=49.81°), (103) diffraction (2θ=66.05°), (200) diffraction (2θ=69.73°) and (202) diffraction (2θ=81.08°) of aluminum nitride were observed except for the sapphire substrate used as the substrate in the θ-2θ mode X-ray diffraction profile, and it was judged that the obtained aluminum nitride was a polycrystal. It is considered that the forming of the polycrystal was due to the fast growing speed as compared with the temperature of the substrate.

Example 4

The operation of Example 1 was repeated except that the distance between the nozzle 47 and the surface of the substrate 43 in FIG. 4 was changed to 50 mm.

The raw material mixed gas was supplied onto the substrate for 60 minutes to grow an aluminum nitride crystal on the substrate. After 60 minutes, the supply of only the aluminum trichloride gas was stopped to terminate the growth of aluminum nitride. After the substrate was cooled to 500° C., the supply of the ammonia gas was stopped and the substrate was further cooled to room temperature and then taken out to be evaluated. As a result, a weight change by aluminum nitride grown on the substrate was an increase of 0.0727 g from that before growth, the average film thickness of aluminum nitride was 11 μm, and the crystal growth speed was 11 μm/hr in terms of film forming speed. The mass of the group III metal immobilized on the substrate (the mass of the immobilized group III metal) was 0.0018 mol. Since the mass of the group III halide gas supplied onto the substrate during growth (the mass of the group III metal supplied onto the substrate) was 0.0107 mol, the yield was calculated as 17%. It is considered that the supply quantity of the raw material reaching the substrate decreased due to a large distance between the nozzle and the substrate, thereby reducing the yield. Only the (002) diffraction and (004) diffraction of aluminum nitride were observed except for the sapphire substrate used as the substrate in the θ-2θ mode X-ray diffraction profile, and it was judged that the obtained aluminum nitride was a single crystal. The rocking curve value of "Tilt" was 270 min.

Example 5

The operation of Example 1 was repeated using the apparatus shown in FIG. 4 except that a shower head type nozzle having a large number of fine holes for ejecting the raw material gases on the end face was installed at the end of the nozzle 47 in FIG. 4, the distance between the end of the nozzle and the surface of the substrate 43 was set to 10 mm, and the temperature of the substrate was set to 1,500° C. The diameter of the outermost periphery of the ejection port of the shower head of the nozzle 47 was 50 mm, and the nozzle had 80 fine holes having a diameter of 1 mm for ejecting the mixed gas which were arranged uniformly on the end face.

The raw material mixed gas was supplied onto the substrate for 60 minutes to grow an aluminum nitride crystal on the substrate. After 60 minutes, the supply of only the aluminum trichloride gas was stopped to terminate the growth of aluminum nitride. After the substrate was cooled to 500° C., the supply of the ammonia gas was stopped and the substrate was further cooled to room temperature and then taken out to be evaluated. As a result, a weight change by aluminum nitride grown on the substrate was an increase of 0.2642 g from that before growth, the average film thickness of aluminum nitride was 40 µm, and the crystal growth speed was 40 µm/hr in terms of film forming speed. The mass of the group III metal immobilized on the substrate (the mass of the immobilized group III metal) was 0.0064 mol. Since the mass of the group III halide gas supplied onto the substrate during growth (the mass of the group III metal supplied onto the substrate) was 0.0107 mol, the yield was calculated as 60%. Only the (002) diffraction and (004) diffraction of aluminum nitride were observed except for the sapphire substrate used as the substrate in the θ-2θ mode X-ray diffraction profile, and it was judged that the obtained aluminum nitride was a single crystal. The rocking curve value of "Tilt" was 320 min.

Example 6

The apparatus shown in FIG. 4 and a mixed gas of an aluminum trichloride gas and a gallium chloride gas was used as the group III halide gas to grow aluminum gallium nitride. 0.15 sccm of the aluminum trichloride gas and 0.1 sccm of the gallium chloride gas were diluted with 10,000 sccm of a nitrogen carrier gas and supplied from the pipe 44, and 5 sccm of an ammonia gas was diluted with 4,995 sccm of a nitrogen carrier gas and supplied from the pipe 45. The supplied gases were joined together in the mixer 46 and supplied onto the substrate 43 from the temperature control nozzle 47 whose temperature was controlled to 300° C. Under this condition, the supply partial pressure of the aluminum trichloride gas in the mixed gas was $1 \times 10^{-5}$ atm, the supply partial pressure of the gallium chloride gas was $2 \times 10^{-4}$ atm, and the ratio of the ammonia gas to the group III halide gas was 20. The operation of Example 1 was repeated except that the substrate heating temperature was changed to 1,200° C. and the inside pressure of the system was changed to 200 Torr.

The raw material mixed gas was supplied onto the substrate for 60 minutes to grow an aluminum gallium nitride single crystal on the substrate. After 60 minutes, the supply of only the group III halide gas was stopped to terminate the growth of aluminum gallium nitride. After the substrate was cooled to 500° C., the supply of the ammonia gas was stopped and the substrate was further cooled to room temperature and then taken out to be evaluated. As a result, a weight change by aluminum gallium nitride grown on the substrate was an increase of 0.005 g from that before growth. When the substrate was cut to observe its section through a scanning electron microscope, the film thickness of aluminum gallium nitride was 0.58 µm, and the crystal growth speed was 0.58 µm/hr in terms of film forming speed. When the energy dispersion type X-ray spectrum of the grown film was measured, the ratio of elemental aluminum to elemental gallium in aluminum gallium nitride was 70:30. The molecular weight of aluminum gallium nitride was assumed to be 53.9 from the ratio of the group III metal element, and the mass of the group III metal immobilized on the substrate (the mass of the immobilized group III metal) was 0.00093 mol. Since the mass of the group III halide gas supplied onto the substrate during growth (the mass of the group III metal supplied onto the substrate) was 0.00041 mol, the yield was calculated as 23%. Even when the substrate was heated at a high temperature, the aluminum-based group III nitride crystal could be grown stably. Only the (002) diffraction and (004) diffraction of aluminum gallium nitride were observed except for the sapphire substrate used as the substrate in the θ-2θ mode X-ray diffraction profile, and the obtained aluminum gallium nitride was a single crystal.

Comparative Example 1

Figure 1:
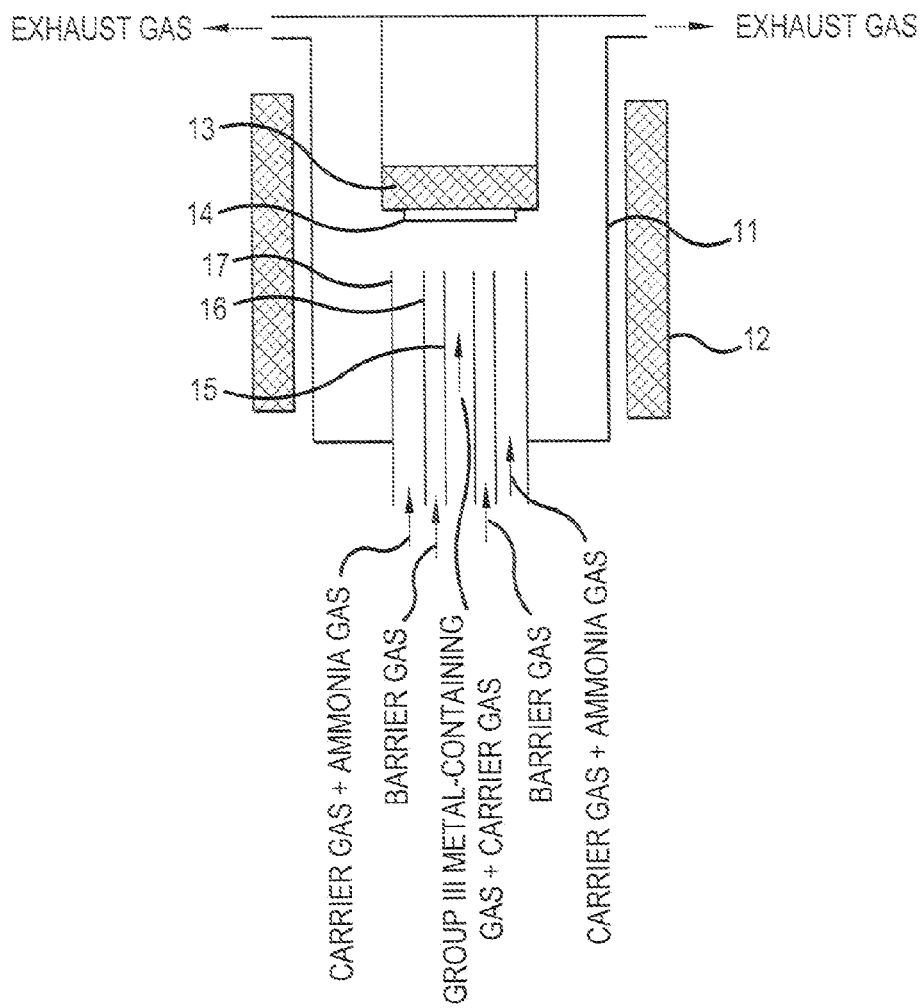
FIG. 1 is a schematic diagram for explaining a conventional vapor-phase epitaxial apparatus.

A reaction for growing aluminum nitride was carried out by using the apparatus shown in FIG. 1. A conventional quartz glass triple tube nozzle was used as the nozzle. Aluminum trichloride was supplied as the group III halide gas from the center nozzle 15 and a nitrogen gas was distributed as a barrier gas from the nozzle 16 on the outer side of the above nozzle. An ammonia gas as the nitrogen source gas diluted with a hydrogen carrier gas was supplied from a portion around the nozzle 16. The distance from the nozzle 16 to the surface of the substrate was 50 mm like Example 4. Other conditions such as the temperature for heating the substrate, the temperature for heating the pipes, the temperature for heating the substrate and the pressure were the same as in Example 1.

As the conditions for supplying the raw material gases, 4 sccm of the aluminum trichloride gas was diluted with 4,996 sccm of a hydrogen carrier gas and supplied from the nozzle 15. 3,000 sccm of the nitrogen gas was supplied as a barrier gas from the barrier nozzle 16. 16 sccm of the ammonia gas was diluted with 3,984 sccm of a hydrogen carrier gas and supplied from a portion around the above nozzle. At this point, the flow rate of the mixed gas was 12,000 sccm and the supply partial pressure of aluminum trichloride was $3.3 \times 10^{-4}$ atm.

The raw material mixed gas was supplied onto the substrate for 60 minutes to grow an aluminum nitride single crystal on the substrate. After 60 minutes, the supply of only the aluminum trichloride gas was stopped to terminate the growth of aluminum nitride. After the substrate was cooled to 500° C., the supply of the ammonia gas was stopped and the substrate was further cooled to room temperature and then taken out to be evaluated. As a result, a weight change by aluminum nitride grown on the substrate was an increase of 0.0350 g from that before growth, the average film thickness of aluminum nitride was 5.3 µm, and the crystal growth speed was 5.3 µm/hr in terms of film forming speed. The mass of the group III metal immobilized on the substrate (the mass of the immobilized group III metal) was 0.00085 mol. Since the mass of the group III halide gas supplied onto the substrate during growth (the mass of the group III metal supplied onto the substrate) was 0.0107 mol, the yield was calculated as 8%. Although the supply quantity of the raw material was the same as in Example 1, it is obvious that the yield in this Comparative Example was lower than that of Example 1. It is understood that the yield was increased by the premixing and supply system of the present invention. Only the (002) diffraction and (004) diffraction of aluminum nitride were observed except for the sapphire substrate used as the substrate in the θ-2θ mode X-ray diffraction profile, and it was judged that the obtained aluminum nitride was a single crystal. The rocking curve value of "Tilt" was 220 min.

Comparative Example 2

The procedure of Example 1 was repeated except that a quartz glass nozzle having no temperature control function was used as the nozzle in the apparatus of Example 1.

Right after the start of supplying the raw materials, a white solid deposit was observed near the end or on the inner wall of the quartz glass nozzle and accumulated along the passage of time.

After 60 minutes, the supply of only the aluminum trichloride gas was stopped to terminate the growth of aluminum nitride. After the substrate was cooled to 500° C., the supply of the ammonia gas was stopped and the substrate was further cooled to room temperature and then taken out to be evaluated. As a result, a weight change by aluminum nitride grown on the substrate was an increase of 0.0086 g from that before growth, the average film thickness of aluminum nitride was 1.3 µm, and the crystal growth speed was 1.3 µm/hr in terms of film forming speed. The mass of the group III metal immobilized on the substrate (the mass of the immobilized group III metal) was 0.00021 mol. Since the mass of the group III halide gas supplied onto the substrate during growth (the mass of the group III metal supplied onto the substrate) was 0.0107 mol, the yield was calculated as 2%. Only the (002) diffraction and (004) diffraction of aluminum nitride were observed except for the sapphire substrate used as the substrate in the θ-2θ mode X-ray diffraction profile, and it was judged that the obtained aluminum nitride was a single crystal. The rocking curve value of "Tilt" was 200 min.

It was found from the measurement result of powder X-ray diffraction that the white solid deposit adhered to the quartz glass nozzle was aluminum nitride. The reason for a great reduction in yield was that, due to an increase in the temperature of the quartz glass nozzle by radiation heat from a heater for heating the substrate, the raw material gas was deposited as aluminum nitride on the end or the inner wall of the quartz glass nozzle before it was supplied onto the substrate. Although the temperature of the nozzle at the time of a reaction could not be measured, it is assumed that it reached 600° C. or higher in consideration of the formation of aluminum nitride. That is, it is confirmed that not only the control of the gas temperature at the time of premixing but also the control of the temperature of the nozzle are important in the premixing and supply system of the present invention.

Comparative Example 3

The procedure of Example 1 was repeated except that the temperature for heating oil circulating in the temperature control nozzle was set to 100° C.

Right after the start of supplying the raw materials, a white solid deposit was observed on the inner wall of the temperature control nozzle 47, and the inner wall of the temperature control nozzle 47 was gradually blocked. Therefore, an experiment was terminated. That is, it is confirmed that stable growth is difficult unless the gas temperature at the time of premixing is suitably controlled in the raw material supply system of the present invention.

The conditions and results of Examples and Comparative Examples are shown in Table 1.

The invention claimed is:

1. A method of producing a group III nitride, comprising the step of reacting a group III halide gas with a nitrogen source gas in a growth chamber to grow a group III nitride on a substrate held in the growth chamber, wherein the method further comprises premixing together the group III halide gas and the nitrogen source gas before they are introduced into the growth chamber and introducing the mixed gas obtained in the premixing step into the growth chamber without forming a deposit in the mixed gas substantially, wherein, to introduce the mixed gas obtained in the premixing step into the growth chamber without forming a deposit in the gas substantially, mixing of the group III halide gas and the nitrogen source gas in the premixing step is carried out at a temperature T (° C.) ranging from a lower limit temperature specified by the following expression (1) to lower than 600° C. when the supply partial pressure of the group III halide gas to be supplied is represented by P (atm) and the obtained mixed gas is introduced into the growth chamber by keeping the temperature of the mixed gas at a range from the lower limit temperature specified by the expression (1) to lower than 600° C.:

$$T = \frac{-2.40 \times 1000}{\log P - 3.03} - 273.15. \tag{1}$$

2. The method of producing a group III nitride according to claim 1, wherein the group III halide gas is an aluminum halide gas or a mixture of an aluminum halide gas and a halide gas of a group III element except aluminum.

3. The method of producing a group III nitride according to claim 1, wherein the growth of the group III nitride in the growing step is carried out at a substrate temperature of 700 to 2,000° C.

4. The method of producing a group III nitride according to claim 1, wherein the group III nitride is aluminum nitride.

5. The method of producing a group III nitride according to according claim 1, wherein the group III nitride is a mixed crystal composed of aluminum nitride and gallium nitride and/or indium nitride and has an aluminum nitride content of not less than 20 mol %.

TABLE 1

| | Supply system | Nozzle | Nozzle temperature | Growth temperature | Grown film thickness | Yield | Distance of nozzle |
|---|---|---|---|---|---|---|---|
| Example 1 | Mixed supply | Temperature control nozzle | 300° C. | 1300° C. | 16 μm | 24% | 25 mm |
| Example 2 | Mixed supply | Temperature control nozzle | 300° C. | 1600° C. | 14 μm | 21% | 25 mm |
| Example 3 | Mixed supply | Temperature control nozzle | 200° C. | 1300° C. | 104 μm | 52% | 10 mm |
| Example 4 | Mixed supply | Temperature control nozzle | 300° C. | 1300° C. | 11 μm | 17% | 50 mm |
| Example 5 | Mixed supply | Temperature control shower head | 300° C. | 1500° C. | 40 μm | 60% | 10 mm |
| Example 6 | Mixed supply | Temperature control shower head | 300° C. | 1200° C. | 0.58 μm | 23% | 25 mm |
| Comparative Example 1 | Separate supply | Quartz glass nozzle | Uncontrollable | 1300° C. | 5.3 μm | 8% | 50 mm |
| Comparative Example 2 | Mixed supply | Quartz glass nozzle | Uncontrollable | 1300° C. | 1.3 μm | 2% | 30 mm |
| Comparative Example 3 | Mixed supply | Temperature control nozzle | 100° C. | 1300° C. | Could not supply | 0% | 30 mm |

6. An apparatus for producing a group III nitride, having a growth chamber comprising gas introduction ports for introducing a group III halide gas and a nitrogen source gas, gas exhaust ports, a susceptor for holding a substrate, and heating means for heating the substrate, wherein the apparatus further comprises a gas introduction nozzle having a temperature control function and a gas mixer, the gas introduction nozzle is installed on the downstream side of the gas mixer, and the gas mixer is connected to the group III halide gas introduction port and the nitrogen source gas introduction port at an upstream.

7. The apparatus for producing a group III nitride according to claim 6, wherein the temperature control function of the gas introduction nozzle is to carry out heat exchange with a liquid heat medium.

8. The apparatus for producing a group III nitride according to claim 6 or 7, wherein the gas introduction nozzle has a plurality of gas ejection holes.

9. The apparatus for producing a group III nitride according to claim 6, wherein the gas introduction nozzle is installed such that the distance between the end of the gas introduction nozzle and the center of the surface of the substrate is 1 to 50 mm.

* * * * *